United States Patent
Nomura et al.

[11] Patent Number: 6,094,068
[45] Date of Patent: Jul. 25, 2000

[54] CMOS LOGIC CIRCUIT AND METHOD OF DRIVING THE SAME

[75] Inventors: Masahiro Nomura; Masakazu Yamashina, both of Tokyo, Japan

[73] Assignee: NEC Corporation, Tokyo, Japan

[21] Appl. No.: 09/098,307

[22] Filed: Jun. 18, 1998

[30] Foreign Application Priority Data

Jun. 19, 1997 [JP] Japan ............................. 9-162867

[51] Int. Cl.[7] ................ H03K 19/0175; H03K 19/094; H03K 19/003; H03K 3/01
[52] U.S. Cl. ........................ 326/83; 326/121; 326/15; 327/534
[58] Field of Search ................ 326/86, 83, 112, 326/119, 121, 17, 15; 327/534

[56] References Cited

U.S. PATENT DOCUMENTS

| | | | |
|---|---|---|---|
| 3,715,603 | 2/1973 | Lerch | 326/36 |
| 4,571,816 | 2/1986 | Dingwall | 438/251 |
| 4,810,906 | 3/1989 | Shah et al. | 326/121 |
| 5,532,620 | 7/1996 | Seo et al. | 326/81 |
| 5,644,266 | 7/1997 | Chen et al. | 327/534 |
| 5,821,783 | 10/1998 | Torimaru et al. | 327/108 |
| 5,970,339 | 10/1999 | Choi | 438/243 |

FOREIGN PATENT DOCUMENTS

| | | |
|---|---|---|
| 57-78165 | 5/1982 | Japan . |
| 57-103346 | 6/1982 | Japan . |
| 58-2061 | 1/1983 | Japan . |
| 61-61260 | 12/1986 | Japan . |
| 62-30421 | 2/1987 | Japan . |
| 62-50984 | 10/1987 | Japan . |
| 63-40358 | 2/1988 | Japan . |
| 63-229848 | 9/1988 | Japan . |
| 5-211291 | 8/1993 | Japan . |
| 7-95032 | 4/1995 | Japan . |

*Primary Examiner*—Michael Tokar
*Assistant Examiner*—James A. Cho

[57] ABSTRACT

A CMOS logic circuit including (a) a PMOS transistor, (b) an NMOS transistor, (c) a first coupling capacitor electrically connected only between a gate and a substrate of the PMOS transistor, and (d) a second coupling capacitor electrically connected between a gate and drain of the NMOS transistor, wherein the PMOS and NMOS transistors include substrate voltages which are made higher than associated reference voltages during rising edges of signals transmitted to the gates, and made lower than the associated reference voltages during falling edges of the signals. The gates of the PMOS and NMOS transistors are electrically connected to each other, drains of the PMOS and NMOS transistors are electrically connected to each other, and an input signal is introduced into the electrically connected gates, and an output signal is taken through the electrically connected drains.

23 Claims, 11 Drawing Sheets

CMOS LOGIC CIRCUIT AND METHOD OF DRIVING THE SAME

BACKGROUND OF THE INVENTION

1. Field of the Invention

The invention relates to CMOS logic circuit, and more particularly to CMOS logic circuit having a reduced delay time and thus being capable of having a higher operation speed.

2. Description of the Related Art

For the purpose of accomplishing a high performance in a MOS integrated circuit, a threshold voltage has been conventionally controlled in a MOS transistor through a circuit. Specifically, it is possible to enhance an operation speed due to an increased driving ability and reduce electric consumption due to a reduction in a leakage current by lowering a threshold voltage while the MOS transistor is in operation, and raising a threshold voltage while the MOS transistor is not in operation.

For instance, Japanese Patent Publication No. 61-61260 published on Dec. 24, 1986 has suggested a circuit for generating such a voltage for biasing a substrate therewith so that a circuit operates most efficiently.

With rapid development in fabricating a semiconductor integrated circuit in a smaller size, it is absolutely necessary to lower a power voltage in order to ensure reliability in operation of the MOS transistor. Consequently, since it is necessary for a high performance MOS transistor which operates at a relatively low voltage, to arrange a threshold voltage in accordance with a scaling rule, it is quite important to reduce leakage current between source and drain regions in a weak inversion region of the MOS transistor.

In order to solve this problem, Japanese Unexamined Patent Publication No. 7-95032 published on Apr. 7, 1995 has suggested CMOS invertor circuit for reducing a leakage current between source and drain regions in a weak inversion region in a MOS transistor. The suggested CMOS invertor is said to be suitable for a device which operates at a relatively low voltage. The suggested circuit includes, as well as CMOS invertor, a first NMOS transistor having a gate electrically connected to an input terminal, a source electrically connected to a ground potential, and a drain electrically connected to a substrate of a second NMOS transistor constituting the CMOS invertor. The suggested circuit further includes a coupling capacitor electrically connected between the input terminal and a substrate of the first NMOS transistor. When an input voltage applied to the CMOS invertor is lower than a threshold voltage of the first NMOS transistor, a negative voltage is applied to a substrate of the second NMOS transistor by virtue of the coupling capacitor, resulting in that a threshold voltage being made higher.

Japanese Unexamined Patent Publication No. 63-229848 published on Sep. 26, 1988 has suggested a semiconductor memory device for reducing a sub-threshold leakage current without reduction in writing and reading-out speed and degradation of a device, by utilizing a variation in a threshold voltage caused by a variation in a potential at a substrate of a MOS transistor. Specifically, a substrate potential of a MOS transfer gate transistor is arranged deep while data is being held in the transistor, whereas a substrate potential is arranged shallow only when data is written into or is read out of the transistor.

Japanese Unexamined Patent Publication No. 57-78165 published on May 15, 1982, which is based on the United States application No. 164284 filed on Jun. 30, 1980, has suggested a circuit for biasing a substrate of a metal-oxide-semiconductor (MOS) integrated circuit, in particular, for biasing a substrate of a random access memory (RAM).

Japanese Unexamined Patent Publication No. 57-103346 has suggested a metal-oxide-semiconductor (MOS) integrated circuit including a self-advancing oscillator, a drive circuit receiving an output generated from the self-advancing oscillator, an AC coupling capacitor electrically connected to the drive circuit, and first and second MOS transistors coupled to each other through a diode. The first MOS transistor makes level-changes, and the second MOS transistor absorbs electric charges to thereby generate a voltage for biasing a substrate therewith. The drive circuit is comprised of third, fourth and fifth MOS transistors connected in series between a power source and a ground. Each of the third and fourth MOS transistors has a gate electrode which receives an output generated from the self-advancing circuit, and the fifth MOS transistor has a gate electrode which receives a reference voltage which is not dependent on a power voltage.

Japanese Unexamined Patent Publication No. 58-2061 has suggested CMOS integrated circuit including p-type MOSFET and n-type MOSFET wherein a potential of a substrate of the p-type MOSFET is set higher than a positive potential of a power source, and a potential of a substrate of the n-type MOSFET is set lower than a negative potential of the power source.

Japanese Unexamined Patent Publication No. 62-30421 published on Feb. 9, 1987 has suggested MOS integrated circuit including a MOS transistor having a source electrode, a back gate electrode, and a drain electrode, and an amplifier having a gain of almost one time. The source electrode of the MOS transistor is electrically connected to an input of the amplifier, and the back gate electrode of MOS transistor is electrically connected to an output of the amplifier.

Japanese Patent Publication No. 62-50984 published on Oct. 28, 1987, which is based on the West German application No. 2812378.6 filed on Mar. 21, 1978, has suggested a semiconductor circuit including at least two field effect transistors formed in a semiconductor crystal. The field effect transistors have source and drain regions both having a first electrical conductivity which are surrounded by semiconductor crystal regions having a second electrical conductivity. A voltage generator including an oscillator and a threshold voltage detector applies an auxiliary voltage between the semiconductor crystal regions and a ground potential. The auxiliary voltage is applied to a certain section of the semiconductor circuit through a pump circuit formed at an output terminal of the voltage generator.

Japanese Unexamined Patent Publication No. 63-40358 published on Feb. 20, 1988 has suggested a semiconductor device including, a MOS transistor, a bipolar transistor, a circuit for generating a substrate potential, a comparator circuit for comparing a reference threshold voltage of the MOS transistor to a predetermined reference voltage, an oscillator circuit for emitting an AC output voltage which is varied in accordance with an output generated from the comparator circuit, a rectifier circuit for rectifying an output generated from the oscillator circuit to thereby turn to a DC potential, and a controller for controlling the substrate potential in accordance with an output generated from the rectifier circuit to thereby control a threshold voltage of the MOS transistor.

Japanese Unexamined Patent Publication No. 5-211291 published on Aug. 20, 1993 has suggested a semiconductor integrated circuit device including a circuit for generating a bias voltage to bias a substrate therewith, having a plurality of CMOS invertors and a pump circuit. The bias voltage generating circuit includes a first circuit for applying a first substrate bias voltage to a semiconductor substrate, and a second circuit for applying a second substrate bias voltage to a semiconductor region having an electrical conductivity opposite to that of the semiconductor substrate.

In the above-mentioned various conventional circuits for controlling a voltage at a substrate, it is most preferable to control a voltage in such a manner that a threshold voltage is set lower for each of the transistors constituting a semiconductor integrated circuit while the semiconductor integrated circuit is in operation, and is set higher while the semiconductor integrated circuit is not in operation.

FIG. 1 illustrates a typical structure of CMOS invertor circuit for controlling a voltage at a substrate in a semiconductor integrated circuit. The illustrated circuit includes PMOS transistor 110, NMOS transistor 120, a first switch 130 for electrically connecting PMOS transistor 110 to either a first power voltage VDD0 or a second power voltage VDD1, and a second switch 140 for electrically connecting NMOS transistor 110 to either a first ground GND0 or a second ground GND1. The first and second switches 130 and 140 receive control signals S by which the switches 130 and 140 are controlled as to whether PMOS and NMOS transistors 110 and 120 are electrically connected to VDD1 or VDD0, or GND0 or GND1, respectively. Gates of PMOS transistor 110 and NMOS transistor 120 are electrically connected to each other, and similarly, drains of PMOS transistor 110 and NMOS transistor 120 are electrically connected to each other. An input signal IN1 is introduced to the thus electrically connected gates, and an output signal OUT1 is generated from the thus electrically connected drains.

Those skilled in the art would readily understand that if a voltage at a substrate is controlled in the above-mentioned manner, a problem would be caused that a circuit for controlling a substrate voltage could not avoid becoming larger in size due to an arrangement of a power source for generating a bias voltage, and separation of a substrate in each of the transistors, an arrangement of switches for switching substrate voltages, and an arrangement of switch control lines would be required.

In addition, it would be necessary to control a switch in each of the transistors for switching a substrate voltage in accordance with whether transistors constituting a semiconductor integrated circuit operate or do not operate. Furthermore, this control has to be carried out in real time. Hence, a circuit for controlling a substrate voltage cannot avoid requiring complicated control.

SUMMARY OF THE INVENTION

It is an object of the present invention to provide a CMOS logic circuit having a reduced delay time, and capable of operating at a higher speed than a conventional one without an increase of a leakage current. It is also an object to provide a method of driving a CMOS logic circuit in such a manner that a delay time thereof is reduced, and the circuit is capable of operating at a higher speed than a conventional one without an increase of a leakage current.

In one aspect of the present invention, there is provided a CMOS logic circuit including (a) a PMOS transistor, (b) an NMOS transistor, (c) a first coupling capacitor electrically connected to a gate of the PMOS transistor, and (d) a second coupling capacitor electrically connected to a gate of the NMOS transistor, wherein the PMOS and NMOS transistors include substrates, voltages of which are made higher than associated reference voltages at rising or leading edges of signals transmitted to the gates, and made lower than the associated reference voltages at falling or trailing edges of the signals.

It is preferable that gates of the PMOS and NMOS transistors are electrically connected to each other and drains of the PMOS and NMOS transistors are electrically connected to each other, and wherein an input signal is introduced into the thus electrically connected gates and an output signal is taken through the thus electrically connected drains.

For instance, the first and second coupling capacitors may be constituted of a PN junction capacitance formed between a substrate having a first electric conductivity and a diffusion region formed in the substrate and having a second electric conductivity. As an alternative, each of the first and second coupling capacities may be constituted of a gate insulating film. Each of the first and second coupling capacities may be constituted of a MOS gate capacitor.

The CMOS logic circuit may be designed to include a plurality of PMOS and NMOS transistors, and diffusion regions formed between the PMOS with NMOS transistors having the same electric conductivity as that of a substrate of the PMOS and NMOS transistors, and having a constant bias voltage being applied to the diffusion regions.

It is preferable that the CMOS logic circuit includes a substrate having a silicon-on-insulator (SOI) structure.

There is further provided a CMOS logic circuit including (a) a PMOS transistor, (b) an NMOS transistor, (c) a first coupling capacitor electrically connected to a gate of the PMOS transistor, and (d) a second coupling capacitor electrically connected to a gate of the NMOS transistor, wherein the PMOS transistor is designed to have a higher threshold voltage and the NMOS transistor is designed to have a lower threshold voltage than an associated reference voltage at rising edges of signals transmitted to gates of the PMOS and NMOS transistors, and wherein the PMOS transistor is designed to have a lower threshold voltage and the NMOS transistor is designed to have a higher threshold voltage than an associated reference voltage at falling edges of signals transmitted to gates of the PMOS and NMOS transistors.

There is still further provided a CMOS NAND logic circuit including (a) a first PMOS transistor, (b) a second PMOS transistor, (c) a first NMOS transistor, (d) a second NMOS transistor, (e) a first coupling capacitor electrically connected to a gate of the first PMOS transistor, (f) a second coupling capacitor electrically connected to a gate of the second PMOS transistor, (g) a third coupling capacitor electrically connected to a gate of the first NMOS transistor, and (h) a fourth coupling capacitor electrically connected to a gate of the second NMOS transistor. The first and second PMOS and NMOS transistors include substrates, voltages of which are made higher than associated reference voltages at rising edges of signals transmitted to the gates, and made lower than the associated reference voltages at falling edges of the signals.

It is preferable that gates of the first PMOS and first NMOS transistors are electrically connected to each other, drains of the first and second PMOS and first NMOS transistors are electrically connected to each other, and gates of the second PMOS and second NMOS transistors are electrically connected to each other, and that a first input signal is introduced into the thus electrically connected gates of the first PMOS and first NMOS transistors and a second input signal is introduced into the thus electrically connected gates of the second PMOS and second NMOS transistors, and an output signal is taken out of the thus electrically connected drains. It is also preferable that a source of the first NMOS transistor and a drain of the second NMOS transistor are electrically connected to each other.

For instance, each of the first to fourth coupling capacities may be constituted of a PN junction capacitance formed between a substrate having a first electric conductivity and a diffusion region formed in the substrate and having a second electric conductivity. As an alternative, each of the first to fourth coupling capacitors may be constituted of a gate insulating film. Each of the first and second coupling capacitors may be constituted of a MOS gate capacitor.

It is preferable for the CMOS NAND logic circuit to include a plurality of PMOS and NMOS transistors, and diffusion regions formed between the PMOS and NMOS transistors and having the same electric conductivity as that of a substrate of the PMOS and NMOS transistors, in which case, a constant bias voltage is applied to the diffusion regions.

It is preferable that the CMOS NAND logic circuit includes a substrate having a silicon-on-insulator (SOI) structure.

There is yet further provided a CMOS NAND logic circuit including (a) a first PMOS transistor, (b) a second PMOS transistor, (c) a first NMOS transistor, (d) a second NMOS transistor, (e) a first coupling capacitor electrically connected to a gate of the first PMOS transistor, (f) a second coupling capacitor electrically connected to a gate of the second PMOS transistor, (g) a third coupling capacitor electrically connected to a gate of the first NMOS transistor, and (h) a fourth coupling capacitor electrically connected to a gate of the second NMOS transistor, wherein the first and second PMOS transistors are designed to have a higher threshold voltage, and the first and second NMOS transistors are designed to have a lower threshold voltage than an associated reference voltage at rising edges of signals transmitted to gates of the first and second PMOS and NMOS transistors, and wherein the first and second PMOS transistors are designed to have a lower threshold voltage and the first and second NMOS transistors are designed to have a higher threshold voltage than an associated reference voltage at falling edges of signals transmitted to gates of the first and second PMOS and NMOS transistors.

In another aspect of the invention, there is provided a method of driving a CMOS logic circuit including (a) a PMOS transistor, (b) an NMOS transistor, (c) a first coupling capacitor electrically connected to a gate of the PMOS transistor, and (d) a second coupling capacitor electrically connected to a gate of the NMOS transistor, including the steps of making voltages at substrates of the PMOS and NMOS transistors higher than associated reference voltages at rising edges of signals transmitted to the gates, and making the voltages lower than the associated reference voltages at falling edges of the signals.

It is preferable for the method to further include the steps of introducing an input signal into electrically connected gates of the PMOS and NMOS transistors, and taking an output signal through electrically connected drains of the PMOS and NMOS transistors.

There is further provided a method of driving a CMOS logic circuit including (a) a PMOS transistor, (b) an NMOS transistor, (c) a first coupling capacitor electrically connected to a gate of the PMOS transistor, and (d) a second coupling capacitor electrically connected to a gate of the NMOS transistor, comprising the steps of making a threshold voltage of the PMOS transistor higher and a threshold voltage of the NMOS transistor lower than an associated reference voltage at rising edges of signals transmitted to gates of the PMOS and NMOS transistors, and making a threshold voltage of the PMOS transistor lower and a threshold voltage of the NMOS transistor higher than an associated reference voltage at falling edges of signals transmitted to gates of the PMOS and NMOS transistors.

There is still further provided a method of driving a CMOS NAND logic circuit including (a) a first PMOS transistor, (b) a second PMOS transistor, (c) a first NMOS transistor, (d) a second NMOS transistor, (e) a first coupling capacitor electrically connected to a gate of the first PMOS transistor, (f) a second coupling capacitor electrically connected to a gate of the second PMOS transistor, (g) a third coupling capacitor electrically connected to a gate of the first NMOS transistor; and (h) a fourth coupling capacitor electrically connected to a gate of the second NMOS transistor, including the steps of making voltages at substrates of the first and second PMOS and NMOS transistors higher than associated reference voltages at rising edges of signals transmitted to the gates, and making the voltages lower than the associated reference voltages at falling edges of the signals.

It is preferable for the method to further include the steps of introducing a first input signal into electrically connected gates of the first PMOS and first NMOS transistors, introducing a second input signal into electrically connected gates of the second PMOS and second NMOS transistors, and taking an output signal through electrically connected drains of the first and second PMOS and first NMOS transistors.

There is yet provided a method of driving a CMOS NAND logic circuit including (a) a first PMOS transistor, (b) a second PMOS transistor, (c) a first NMOS transistor, (d) a second NMOS transistor, (e) a first coupling capacitor electrically connected to a gate of the first PMOS transistor, (f) a second coupling capacitor electrically connected to a gate of the second PMOS transistor, (g) a third coupling capacitor electrically connected to a gate of the first NMOS transistor; and (h) a fourth coupling capacitor electrically connected to a gate of the second NMOS transistor, including the steps of making a threshold voltage of the first and second PMOS transistors higher and a threshold voltage of the first and second NMOS transistors lower than an associated reference voltage at rising edges of signals transmitted to gates of the first and second PMOS and NMOS transistors, and making a threshold voltage of the first and second PMOS transistors lower and a threshold voltage of the first and second NMOS transistors higher than an associated reference voltage at falling edges of signals transmitted to gates of the first and second PMOS and NMOS transistors.

In accordance with the above-mentioned present invention, a threshold voltage of a PMOS transistor is set higher and a threshold voltage of NMOS transistor is set lower both at a rising edge of an input signal, and a threshold voltage of PMOS transistor is set lower and a threshold voltage of NMOS transistor is set higher both at a falling edge of an input signal. As a result, it is possible to reduce the delay in a CMOS logic circuit.

In addition, in a PMOS transistor and, a NMOS transistor making a pair, one of transistors in the process of turn-on from turn-off is set to have a lower threshold voltage, and the other in the process of turn-off from turn-on is set to have a higher threshold voltage. Hence, it is possible to avoid a resistance between a power source and a ground from being reduced, with the result that a leakage current in the CMOS logic circuit is kept from increasing.

In accordance with the present invention, a drive ability of driving transistors is enhanced. As a result, a signal varies steeply, which ensures that a through current is reduced.

It is no longer necessary to arrange an auxiliary power source, a switch for switching a substrate voltage, and external control system. Hence, a potential at a substrate can be efficiently controlled.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
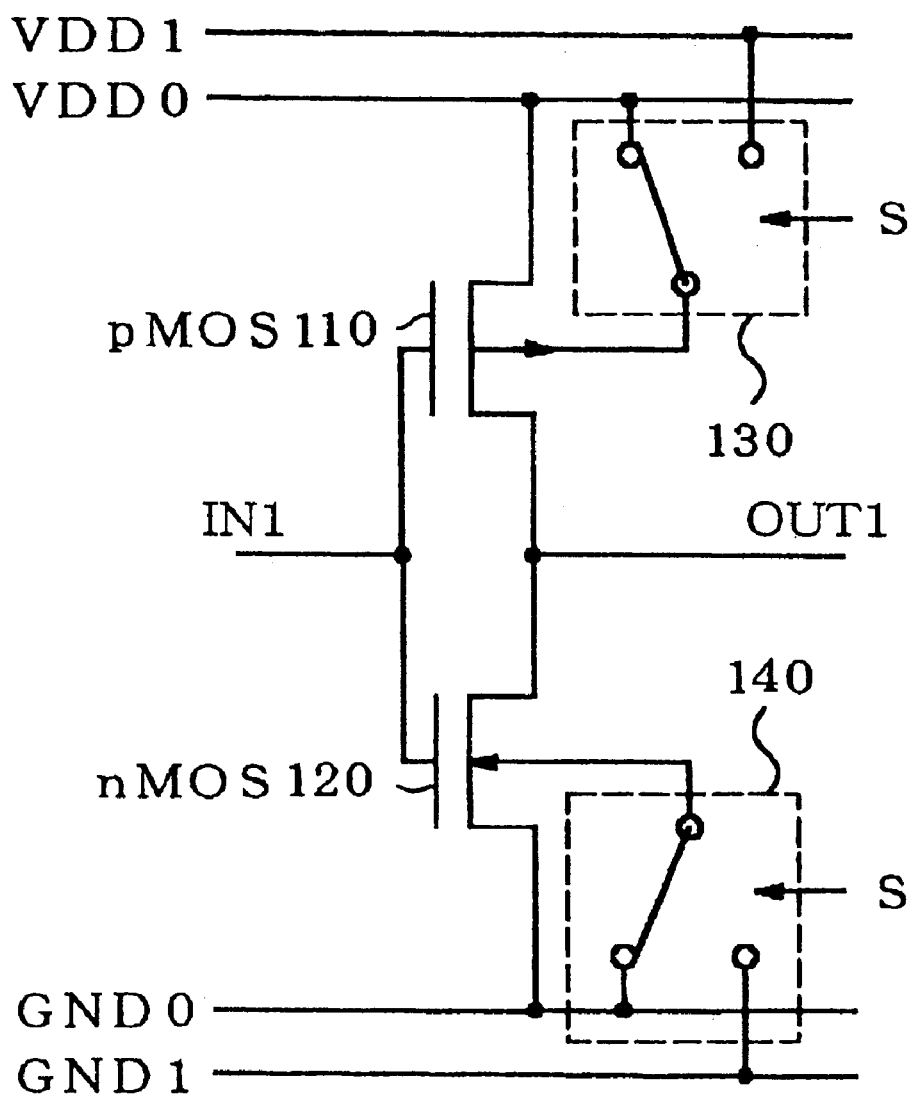
FIG. 1 is a circuit diagram of a prior CMOS invertor including switches for switching a substrate voltage.
Figure 2:
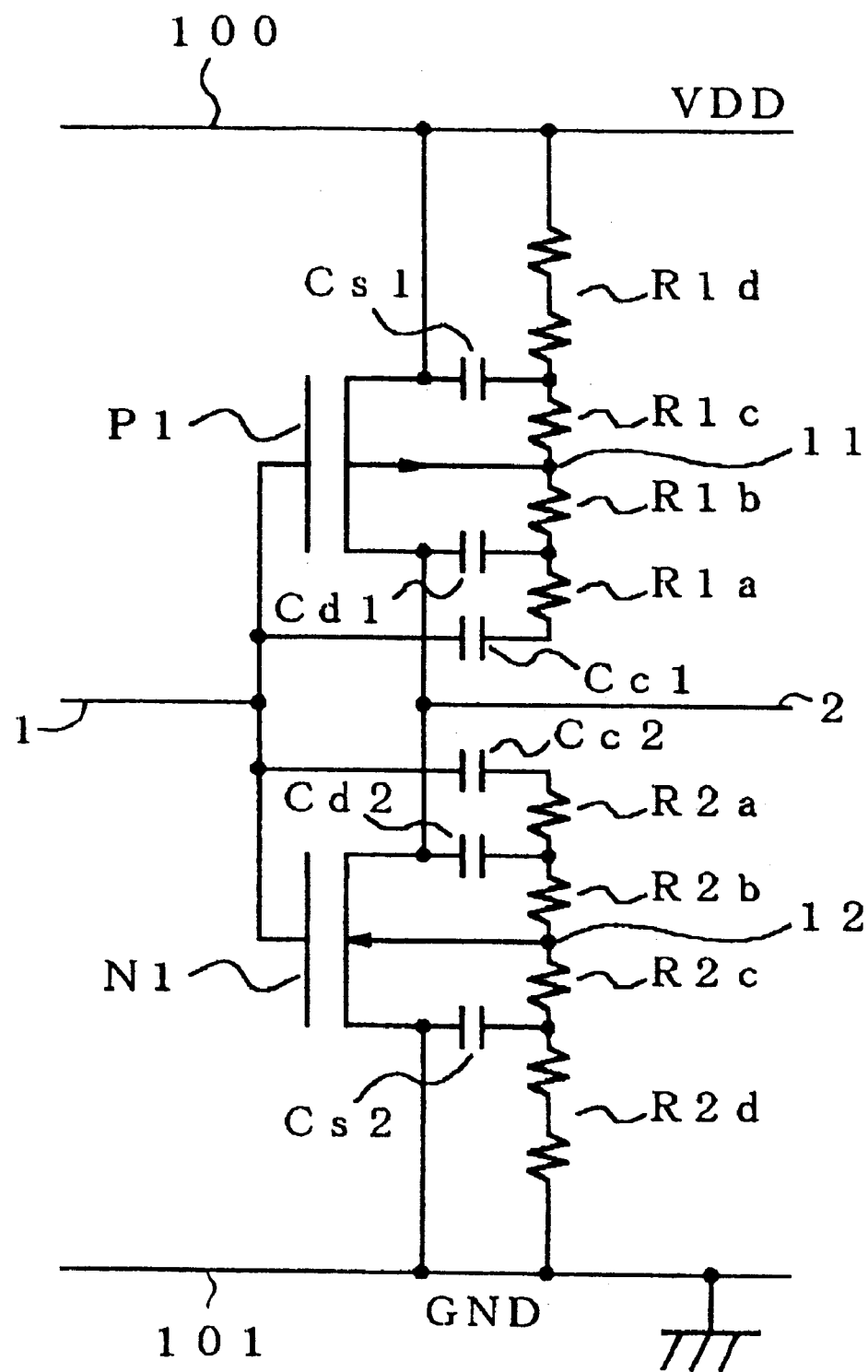
FIG. 2 is a circuit diagram of CMOS invertor in accordance with the first embodiment of the present invention.

FIG. 2 is a circuit diagram of CMOS invertor in accordance with the first embodiment. The illustrated CMOS invertor includes PMOS transistor P1, NMOS transistor N1, a first coupling capacitor Cc1 electrically connected between a gate and a drain of PMOS transistor P1, and a second coupling capacitor Cc2 electrically connected between a gate and a drain of NMOS transistor N1.

Gates of PMOS transistor P1 and NMOS transistor N1 are electrically connected to each other, and drains of PMOS transistor P1 and NMOS transistor N1 are electrically connected to each other. An input signal 1 is introduced into both the thus connected gates of PMOS transistor Pi and NMOS transistor N1 and the first and second coupling capacities Cc1 and Cc2. An output signal 2 is generated through the connected drains of PMOS transistor P1 and NMOS transistor N1.

PMOS transistor P1 includes a n-type well 11 as a substrate, and NMOS transistor N1 includes a p-type well 12 as a substrate. The n-type well 11 is electrically connected to a power supply line 100, and the p-type well 12 is electrically connected to a ground line 101.

The n-type well 11 has parasitic resistances R1a, R1b, R1c and R1d between the first coupling capacitor Cc1 and the power supply line 100, and similarly, the p-type well 12 has parasitic resistances R2a, R2b, R2c and R2d between the second coupling capacitor Cc2 and the ground line 101. A drain has a drain diffusion capacitor Cd1, and a source has a source diffusion capacitor Cs1 in PMOS transistor P1. Similarly, a drain has a drain diffusion capacitor Cd2, and a source has a source diffusion capacitor Cs2 in NMOS transistor N1.

The n-type well 11 and the p-type well 12 are influenced by the output signal 2 through the parasitic resistances R1a to R1d and R2a to R2d and the drain diffusion capacitors Cd1 and Cd2. Thus, there is generated fluctuation in a potential at substrates of PMOS transistor P1 and NMOS transistor N1 each of which constitutes a back gate, dependent on values of the parasitic resistances R1a to R1d and R2a to R2d and the drain diffusion capacitors Cd1 and Cd2.

Figure 3:
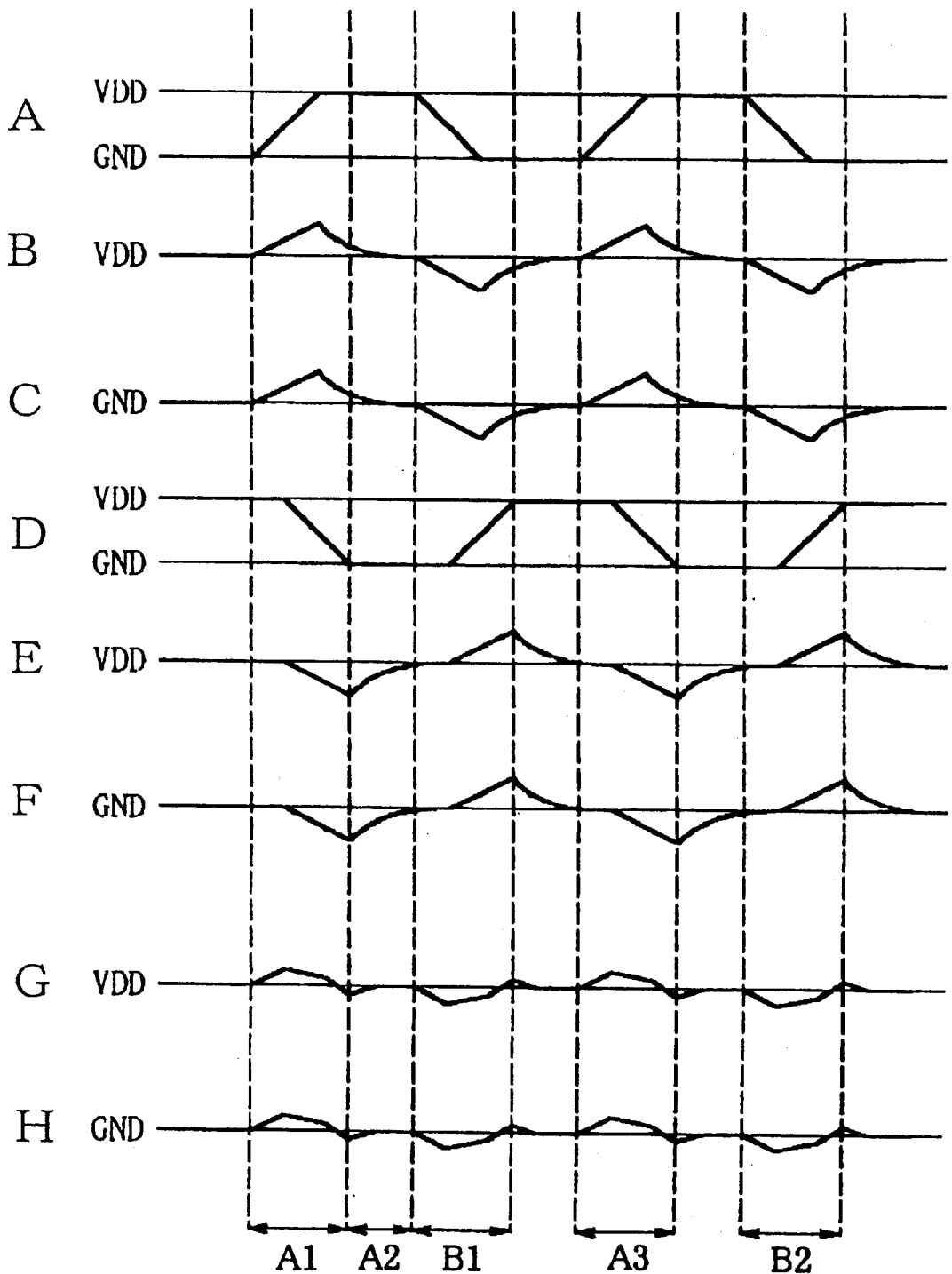
FIG. 3 illustrates waveforms representing potentials in CMOS invertor illustrated in FIG. 2.

Hereinbelow is explained an operation of CMOS invertor illustrated in FIG. 2, with reference to FIG. 3 illustrating waveforms representing potentials in CMOS invertor.

In FIG. 3, A represents a waveform of the input signal 1, B represents a potential just below the first coupling capacitor Cc1, C represents a potential just below the second coupling capacitor Cc2, D represents a waveform of the output signal 2, E represents a potential just below a drain of PMOS transistor P1, F represents a potential just below a drain of NMOS transistor N1, G represents a potential of the substrate 11 of PMOS transistor P1, and H represents a potential of the substrate 12 of NMOS transistor N1.

The input signal 1 varies substrate potentials just below the first and second coupling capacitors Cc1 and Cc2 in the same phase through the first and second coupling capacitors Cc1 and Cc2. The output signal 2 is identical to an inversion of the delayed input signal 1. The output signal 2 varies substrate potentials just below the drain diffusion capacities Cd1 and Cd2 in opposite phase through the drain diffusion capacities Cd1 and Cd2 when a certain period of time defined by the delay time of the CMOS invertor passes after the input signal 1 has been introduced into the CMOS invertor.

The potentials represented as B, C, E and F are defined and varied in dependence on waveforms of the input and output signals I and 2, values of the first and second coupling capacities Cc1 and Cc2, values of the parasitic resistances R1a to R1d, values of the parasitic resistances R2a to R2d, values of the drain diffusion capacitors Cd1 and Cd2, and values of the source diffusion capacitors Cs1 and Cs2. The potentials at the substrates 11 and 12 of PMOS and NMOS transistors P1 and N1, represented as G and H, respectively, are defined by a sum of potentials associated with the parasitic resistances R1a to R1d and R2a to R2d.

In FIG. 3, in a period of time represented as A1, the input signal 1 rises up, PMOS transistor P1 is turned off from on, NMOS transistor N1 is turned on from off, and the output signal 2 falls down. As the input signal 1 varies, the potentials at the substrates 11 and 12 are raised through the first and second coupling capacitors Cc1 and Cc2. When the output signal 2 begins to fall down, the variation in the potentials at the substrates 11 and 12 is cancelled with the variation in the output signal 2 which is made through the drain diffusion capacitors Cd1 and Cd2. As a result, the potentials at the substrates 11 and 12 become flattened.

In a latter half of the period A1, when the input signal 1 is kept at a high level thereof, the potentials at the substrates 11 and 12 are lowered in accordance with variation in the output signal 2. While a period of time A2 in which the input and output signals 1 and 2 are kept constant, the potential at the substrate 11 is converged to the power voltage VDD and the potential at the substrate 12 is converged to the ground voltage GND in accordance with a time constant CR defined by values of the parasitic resistances R and parasitic capacities C.

In the period of time A1, the potentials at the substrates 11 and 12 are raised, a threshold voltage Vpt of PMOS transistor P1 is raised, and a threshold voltage Vnt of NMOS transistor N1 is lowered. As a result, a leakage current passing through PMOS transistor P1 and NMOS transistor N1 is suppressed, and a drive current passing through NMOS transistor N1 is increased. This ensures that a delay time with which the input signal 1 falls is reduced.

In the contrary, in a period of time B, the potentials at the substrates 11 and 12 are reduced, the threshold voltage Vpt of PMOS transistor P1 is lowered, and the threshold voltage Vnt of NMOS transistor N1 is raised. As a result, a leakage current passing through PMOS transistor P1 and NMOS transistor N1 is suppressed, and a drive current passing through PMOS transistor P1 is increased. This ensures that a delay time with which the input signal 1 falls is reduced.

Figure 4:
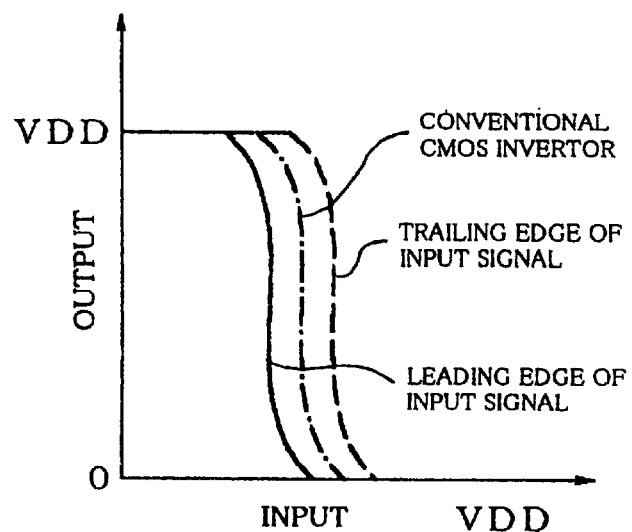
FIG. 4 illustrates an input and output characteristic in a conventional CMOS invertor and CMOS invertor in accordance with the first embodiment.

Hereinbelow is explained a comparison in input and output characteristic between a conventional CMOS invertor and CMOS invertor in accordance with the present invention. As shown with a dashed line in FIG. 4, a logical threshold voltage is constant regardless of an input signal in a conventional CMOS transistor. On the other hand, since a threshold voltage of PMOS transistor P1 can be made higher and a threshold voltage of NMOS transistor N1 can be made lower at rising edge of an input signal, and a threshold voltage of PMOS transistor P1 can be made lower and a threshold voltage of NMOS transistor N1 can be made higher at a falling edge of an input signal in accordance with the first embodiment, a logical threshold voltage can be made lower at a leading edge of an input signal, as shown with a solid line, and a logical threshold voltage can be made higher at a trailing edge of an input signal, as shown with a broken line. Thus, it is possible to reduce the delay time in a CMOS invertor.

In a CMOS invertor circuit in accordance with the present embodiment, PMOS transistor P1 and NMOS transistor N1 make a pair. In such a pair, one of the transistors in the process of transitioning to "on" from "off" is set to have a lower threshold voltage, and the other transistor in the process of turn-off from turn-on is set to have a higher threshold voltage. Hence, it is possible to avoid the resistance between the power source and ground from being reduced, with the result that an increased leakage current in the CMOS logic circuit is suppressed.

In accordance with the present embodiment, a drive ability in each of a PMOS and NMOS transistors P1 and N1 is enhanced. As a result, a signal varies steeply, which ensures that through current is reduced. Hereinbelow is explained this advantage with reference to FIG. 5A illustrating a waveform which shows how an input to a CMOS invertor and a through current vary with the lapse of time in a conventional CMOS invertor, and FIG. 5B illustrating a waveform which shows how an input signal to a CMOS invertor and a through current vary with the lapse of time in a CMOS invertor in accordance with the first embodiment.

Figure 5A:
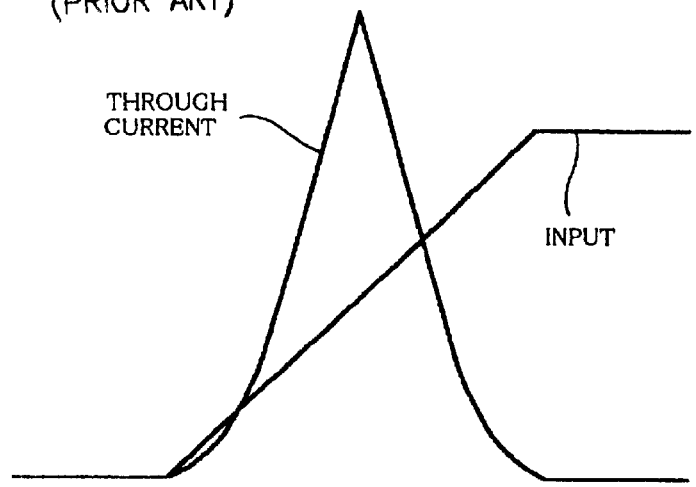
FIG. 5A illustrates a relation between an inclination of an input signal and a through current in a conventional CMOS invertor.
Figure 5B:
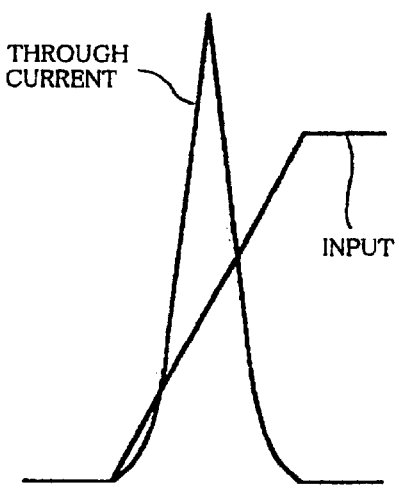
FIG. 5B illustrates a relation between an inclination of an input signal and a through current in CMOS invertor in accordance with the first embodiment.

In comparison between FIGS. 5A and 5B, it is understood that an input signal introduced into the CMOS invertor in accordance with the first embodiment varies more steeply than an input signal introduced into a conventional CMOS invertor, ensuring that a through current is enormously reduced.

Second Embodiment

Figure 6:
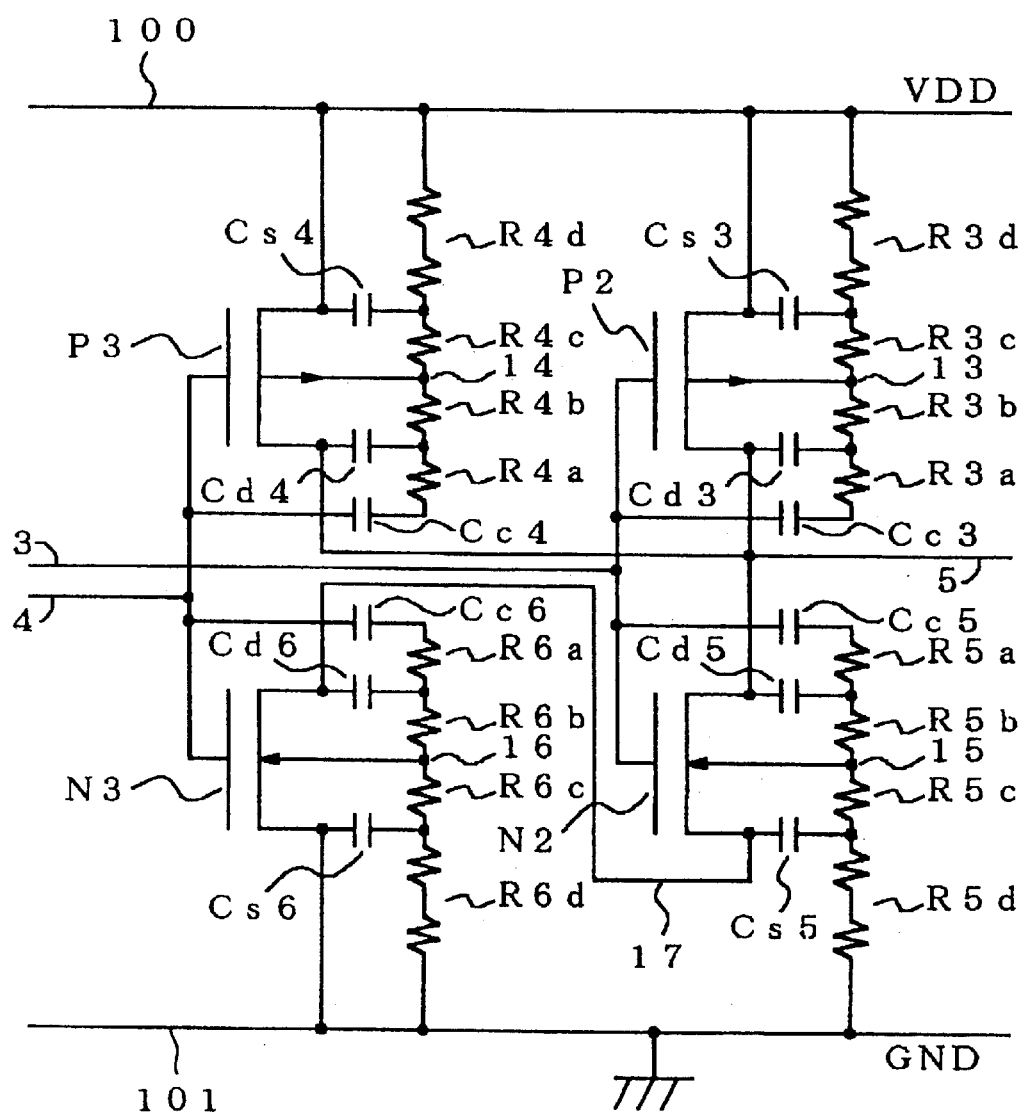
FIG. 6 is a circuit diagram of CMOS NAND circuit in accordance with the second embodiment of the present invention.

FIG. 6 is a circuit diagram of CMOS NAND circuit in accordance with the second embodiment. The illustrated CMOS NAND includes a first PMOS transistor P2, a second PMOS transistor P3, a first NMOS transistor N2, a second NMOS transistor N3, a first coupling capacitor Cc3 electrically connected between a gate and a drain in the first PMOS transistor P2, a second coupling capacitor Cc4 electrically connected between a gate and a drain in the second PMOS transistor P3, a third coupling capacitor Cc5 electrically connected between a gate and a drain in the first NMOS transistor N2, and a fourth coupling capacitor Cc6 electrically connected between a gate and a drain in the second NMOS transistor N3.

Gates of the first PMOS transistor P2 and the first NMOS transistor N2 are electrically connected to each other, and gates of the second PMOS transistor P3 and the second NMOS transistor N3 are electrically connected to each other. Drains of the first PMOS transistor P2, the second PMOS transistor P3, and the first NMOS transistor N2 are electrically connected to one another. A source of the first NMOS transistor N2 is electrically connected to a drain of the second NMOS transistor N3.

A first input signal 3 is introduced into both the thus connected gates of the first PMOS transistor P2 and the first NMOS transistor N2, and the first and third coupling capacitors Cc3 and Cc5. A second input signal 4 is introduced into both the thus connected gates of the second PMOS transistor P3 and the second NMOS transistor N3, and the second and fourth coupling capacitors Cc4 and Cc6. An output signal 5 is generated through the connected drains of the first PMOS transistor P2, the second PMOS transistor P3, and the first NMOS transistor N2.

The first PMOS transistor P2 includes a n-type well 13 as a substrate, and the second PMOS transistor P3 includes a n-type well 14 as a substrate. The first NMOS transistor N2 includes a, p-type well 15 as a substrate, and the second NMOS transistor N3 includes a p-type well 16 as a substrate. The n-type wells 13 and 14 are electrically connected to a power supply line 100, and the p-type wells 15 and 16 are electrically connected to a ground line 101.

The n-type well 13 has parasitic resistances R3a, R3b, R3c and R3d between the first coupling capacitor Cc3 and the power supply line 100. The n-type well 14 has parasitic resistances R4a, R4b, R4c and R4d between the second coupling capacitor Cc4 and the power supply line 100. The p-type well 15 has parasitic resistances R5a, R5b, R5c and R5d between the third coupling capacitor Cc5 and the ground line 101. The p-type well 16 has parasitic resistances R6a, R6b, R6c and R6d between the fourth coupling capacitor Cc6 and the ground line 101. A drain has a drain diffusion capacitor C$d$3, and a source has a source diffusion capacitor C$s$3 in the first PMOS transistor P2. A drain has a drain diffusion capacitor C$d$4, and a source has a source diffusion capacitor C$s$4 in the second PMOS transistor P3. Similarly, a drain has a drain diffusion capacitor C$d$5, and a source has a source diffusion capacitor C$s$5 in the first NMOS transistor N2. A drain has a drain diffusion capacitor C$d$6, and a source has a source diffusion capacitor C$s$6 in the second NMOS transistor N3.

The n-type wells 13, 14 and the p-type wells 15, 16 have the parasitic resistances R3$a$ to R3$d$ and R6$a$ to R6$d$, respectively, and are influenced by the output signal 5 through the drain diffusion capacitors C$d$3 to C$d$6. In addition, the n-type wells 13, 14 and the p-type wells 15, 16 are influenced by an intermediate signal 17 passing between the drain diffusion capacitor C$d$6 and the source diffusion capacitor C$s$5. Hence, there are generated fluctuations in potentials at the substrates 13, 14, 15 and 16 each constituting a back gate, in accordance with values of the above-mentioned parasitic resistances and parasitic capacitors.

Figure 7:
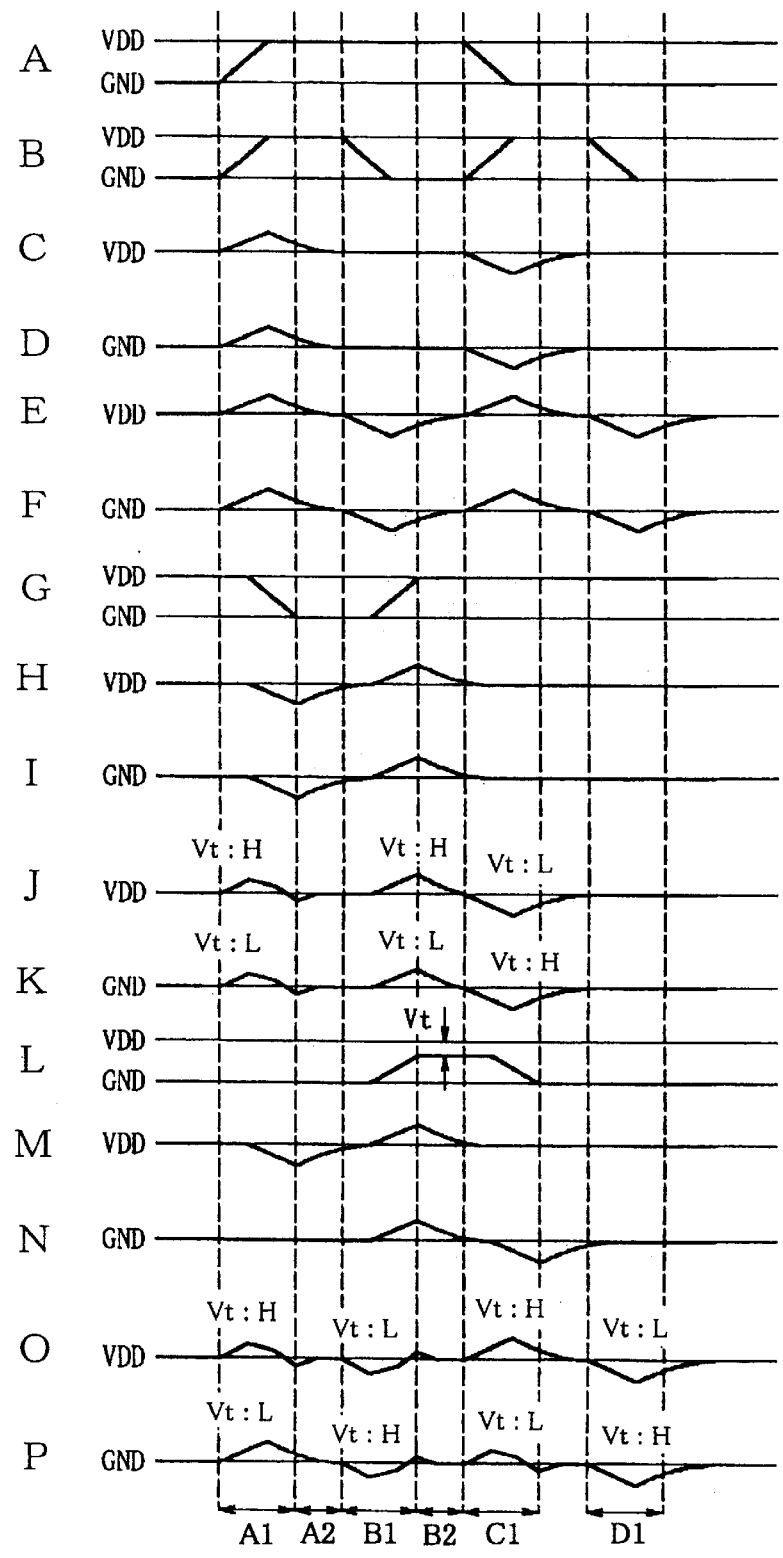
FIG. 7 illustrates waveforms of signals transmitted in CMOS NAND circuit in accordance with the second embodiment.

Hereinbelow is explained an operation of CMOS NAND circuit illustrated in FIG. 6, with reference to FIG. 7 illustrating waveforms representing potentials in the CMOS NAND circuit In FIG. 7, A represents a waveform of the first input signal 3, B represents a waveform of the second input signal 4, C to F represent potentials just below the first and second coupling capacitors C$c$3 to C$c$6, respectively, G represents a waveform of the output signal 5, H represents a potential just below a drain of the first PMOS transistor P2, I represents a potential just below a drain of the first NMOS transistor N2, J represents a potential at the substrate 13 of the first PMOS transistor P2, K represents a potential at the substrate 15 of the first NMOS transistor N2, L represents a waveform of the intermediate signal 17, M represents a potential just below a drain of the second PMOS transistor P3 (namely, just below a drain of the first NMOS transistor N2), N represents a potential just below a drain of the second NMOS transistor N3, O represents a potential at the substrate 14 of the second PMOS transistor P3, and P represents a potential at the substrate 16 of the second NMOS transistor N3.

The first and second input signals 3 and 4 vary substrate potentials just below the first to fourth coupling capacitors C$c$3 to C$c$6 in the same phase through the first to fourth coupling capacitors C$c$3 to C$c$6. The output signal 5 varies substrate potentials just below the drain diffusion capacitors C$d$3 to C$d$6 in opposite phase through the drain diffusion capacitors C$d$3 to C$d$6. The intermediate signal 17 varies substrate potentials just below both a drain of the second NMOS transistor N3 and a source of the first NMOS transistor N2 through the drain diffusion capacitor C$d$6 and the source diffusion capacitor C$s$5.

The potentials represented as C to F, H to K, and M to P are defined and varied in dependence on waveforms of the first and second input signals 3 and 4, the output signal 5, and the intermediate signal 17, values of the first and second coupling capacitors C$c$1 and C$c$2, values of first to fourth coupling capacitors C$c$3 to C$c$6, values of the parasitic resistances R3$a$ to R3$d$, R4$a$ to R4$d$, R5$a$ to R5$d$, and R6$a$ to R6$d$, values of the drain diffusion capacitors C$d$3 to C$d$6, and values of the source diffusion capacitors C$s$3 to C$s$6. The potentials at the substrates 13, 14, 15 and 16 of the first and second PMOS and NMOS transistors P1, P2 and N1, N2 represented as J, O, K, and P, respectively, are defined by a sum of potentials associated with the parasitic resistances R3$a$ to R3$d$, R4$a$ to R4$d$, R5$a$ to R5$d$, and R6$a$ to R6$d$.

In FIG. 7, in a period of time represented as A1, the first and second input signals 3 and 4 rise, the first and second PMOS transistors P2 and P3 are turned off from on, the first and second NMOS transistors N2 and N3 are turned on from off, and the output signal 5 falls. As the first and second input signals 3 and 4 vary, the potentials at the substrates 13 to 16 are raised through the first to fourth coupling capacitors C$c$3 to C$c$6. When the output signal 5 begins to fall, an increase in the potentials at the substrates 13 to 15 is cancelled with the variation in the output signal 5 which is provided through the drain diffusion capacitors C$d$3 to C$d$5. As a result, the potentials at the substrates 13 to 15 flatten. In a latter half of the period A1, when the first and second input signals 3 and 4 are kept at a high level, the potentials at the substrates 13 to 15 are lowered in accordance with variation in the output signal 5. While a period of time A2 in which the first and second input and output signals 3, 4, 5 are kept constant, the potentials at the substrates 13 and 14 converge to the power voltage VDD and the potentials at the substrates 15 and 16 converge to the ground voltage GND in accordance with a time constant CR defined by values of the parasitic resistances R and parasitic capacitors C.

In a period of time represented as B1, the second input signal 4 falls down, the second PMOS transistor P3 is turned on from off, the second NMOS transistor N3 is turned off from on, and the output and intermediate signals 5 and 17 both rise. As the second input signal 4 varies, the potentials at the substrates 14 and 16 are lowered through the second and fourth coupling capacitors C$c$4 and C$c$6. When both the output and intermediate signals 5 and 17 begin to rise, the potentials at the substrates 13 to 15 are raised in accordance with the variation in the output signal 5 which is provide through the drain diffusion capacitors C$d$3 to C$d$5. In addition, the potentials at the substrates 13 and 15 are raised in accordance with the variation in the intermediate signal 17 (see FIG. 7-L) which is provide through the source diffusion capacitors C$s$5 and the drain diffusion capacitor C$d$6, and hence, a decrease in the potentials at the substrates 14 and 16 is cancelled with an increase in the potentials at the substrates 13 and 15. As a result, the potentials at the substrates 14 and 16 flatten.

In a latter half of the period B1, when the first input signal 3 is kept at a low level thereof, the potentials at the substrates 13 to 16 are raised in accordance with the variation in the output and intermediate signals 5 and 17. Since the intermediate signal 17 rises up through the first NMOS transistor N2, the intermediate signal 17 has a voltage defined as (VDD−Vt) where VDD indicates the power voltage which is equal to a gate voltage of the first NMOS transistor N2, and Vt indicates a threshold voltage. While a period of time B2 in which the first and second input and output signals 3, 4, 5 are kept constant, the potentials at the substrates 13 and 14 are converged to the power voltage VDD and the potentials at the substrates 15 and 16 are converged to the ground voltage GND in accordance with a time constant CR defined by values of the parasitic resistances R and parasitic capacitors C.

In a period of time represented as C1, the first input signal 3 falls, the first PMOS transistor P2 is turned on from off, and the first NMOS transistor N2 is turned off from on. The second input signal 4 rises up, the second PMOS transistor P3 is turned off from on, and the second NMOS transistor N3 is turned on from off. The output signal 5 is kept at a high level thereof, and the intermediate signal 17 falls. As the first input signal 3 varies, the potentials at the substrates 13 and 15 are lowered through the first and third coupling capacitors C$c$3 and C$c$5. Similarly, as the second input signal 4 varies, the potentials at the substrates 14 and 16 are raised through the second and fourth coupling capacitors C*c*4 and C*c*6. Then, when the intermediate signal 17 begins to fall, the potentials at the substrates 15 and 16 are lowered in accordance with the decrease in the intermediate signal 17 which is made through the source diffusion capacitor C*s*5 and the drain diffusion capacitor C*d*6, and the potential at the substrate 15 is further lowered. An increase in the potential at the substrate 16 is cancelled with a decrease in the potential at the substrate 15. As a result, the potential at the substrate 16 flattens.

When the first and second input signals 3 and 4 are kept constant, the potentials at the substrates 15 and 16 are lowered in accordance with the variation in the intermediate signal 17. After the first and second input signals 3 and 4 have been kept constant, the potentials at the substrates 13 and 14 converge to the power voltage VDD and the potentials at the substrates 15 and 16 are converged to the ground voltage GND in accordance with a time constant CR defined by values of the parasitic resistances R and parasitic capacitors C.

In a period of time represented as D1, the second input signal 4 falls, the second PMOS transistor P3 is turned on from off, and the second NMOS transistor N3 is turned off from on. The output and intermediate signals 5 and 17 are kept unchanged. As the second input signal 4 varies, the potentials at the substrates 14 and 16 are lowered through the second and fourth coupling capacitors C*c*4 and C*c*6. After the second input signal 4 has been kept at a low level thereof, the potentials at the substrates 13 and 14 are converged to the power voltage VDD and the potentials at the substrates 15 and 16 are converged to the ground voltage GND in accordance with a time constant CR defined by values of the parasitic resistances R and parasitic capacitors C.

In the period of time A1, the potentials at the substrates 13 to 16 are raised, threshold voltages of the first and second PMOS transistors P2 and P3 are raised, and threshold voltages of the first and second NMOS transistors N2 and N3 are lowered. As a result, a leakage current passing through the first and second PMOS transistors P2 and P3 and the first and second NMOS transistors N2 and N3 is suppressed, and a drive current passing through the first and second NMOS transistors N2 and N3 is increased. This ensures that a delay time by which the first and second input signals 3 and 4 fall is reduced.

In a period of time B1, the potentials at the substrates 14 and 16 are lowered, a threshold voltage of the second PMOS transistor P3 is lowered, and a threshold voltage of the second NMOS transistor N3 is raised. As a result, a leakage current passing through the first and second PMOS transistors P2 and P3 and the first and second NMOS transistors N2 and N3 is suppressed, and a drive current passing through the second PMOS transistor P3 is increased. This ensures that a delay time by which the first and second input signals 3 and 4 rise is reduced.

In the period of time C1, the potentials at the substrates 13 and 15 are lowered, and the potentials at the substrates 14 and 16 are raised, a threshold voltage of the first PMOS transistor P2 is lowered, and a threshold voltage of the second PMOS transistor P3 is raised. A threshold voltage of the first NMOS transistor N2 is raised, and a threshold voltage of the second NMOS transistor N3 is lowered. Since a threshold voltage of the first NMOS transistor N2 is raised, though a threshold voltage of the second NMOS transistor N3 is lowered, no increase in leakage current caused by the variation in the first and second input signals 3 and 4 is generated.

In a period of time D1, the potentials at the substrates 14 and 16 are lowered, a threshold voltage of the second PMOS transistor P3 is lowered, and a threshold voltage of the second NMOS transistor N3 is raised. Hence, since a threshold voltage of the second NMOS transistor N3 is at a high level thereof, no increase in leakage current caused by the variation in the second input signal 4 is generated.

Figures 8A, 8B:
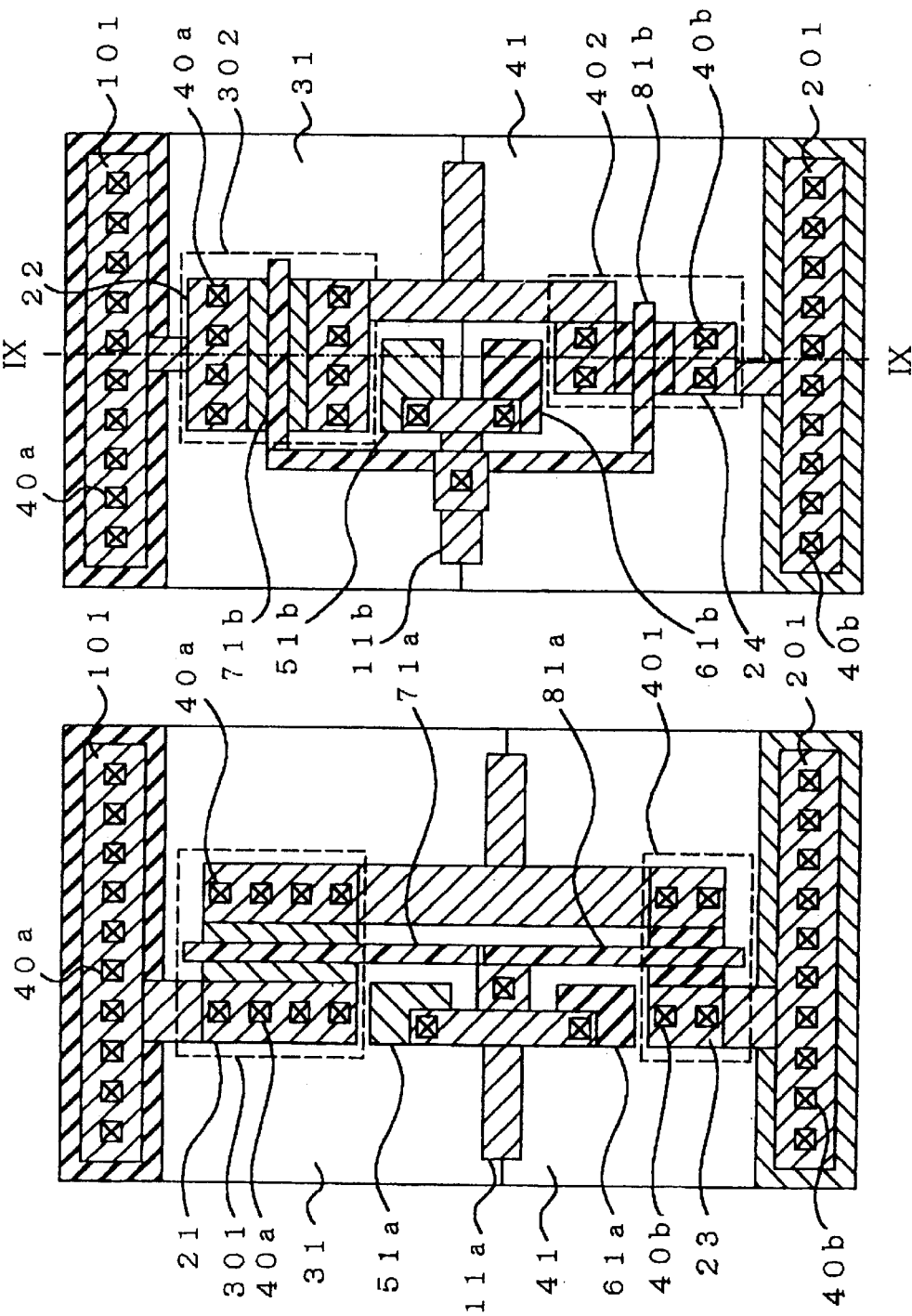
FIGS. 8A and 8B are plan views of CMOS invertor in accordance with the third embodiment.
Figure 9:
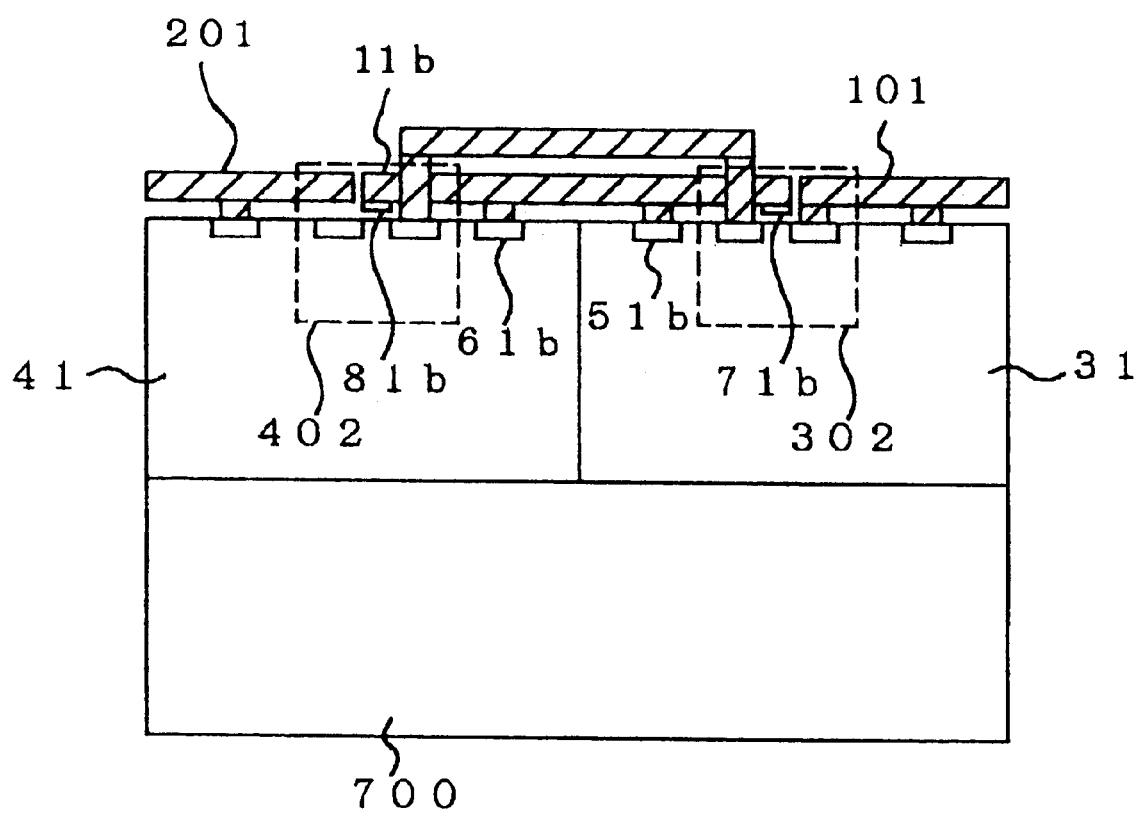
FIG. 9 is a cross-sectional view taken along the line IX and IX in FIG. 8B.

FIGS. 8A and 8B are plan views of the CMOS invertor illustrated in FIG. 6, and FIG. 9 is a cross-sectional view taken along the line IX and IX in FIG. 8B. As illustrated, first and second PMOS transistors 301 and 302 are formed in a n-type well 31 which is formed in a p-type substrate 700. The first and second PMOS transistors 301 and 302 include gates electrically connected to input regions 11*a* and 11*b* through gate polysilicon layers 71*a* and 71*b* and metal wirings, and sources 21 and 22 electrically connected to a power source 101 through contacts 40*a* and metal wirings.

Similarly, first and second NMOS transistors 401 and 402 are formed in a p-type well 41 formed in the p-type substrate 700. The first and second NMOS transistors 401 and 402 include gates electrically connected to the input regions 11*a* and 11*b* through gate polysilicon layers 81*a* and 81*b* and metal wirings, and sources 23 and 24 electrically connected to a ground line 201 through contacts 40*b* and metal wirings.

The input regions 11*a* and 11*b* are electrically connected to p-type diffusion regions of coupling capacitors 51*a* and 51*b* formed in the n-type well 31, and also electrically connected to n-type diffusion regions of coupling capacitors 61*a* and 61*b* formed in the p-type well 41.

The coupling capacitors 51*a* and 51*b* are constituted of the n-type well 31 and pn junction capacitor of the p-type diffusion region, and the coupling capacitors 61*a* and 61*b* are constituted of the p-type well 41 and pn junction capacitor of the n-type diffusion region. These coupling capacitors 51*a*, 51*b*, 61*a* and 61*b* are situated in the vicinity of the first and second PMOS and NMOS transistors 301, 302, 401, 402, respectively, to thereby lower an impedance between each of the MOS transistors and each of the coupling capacitors 51*a*, 51*b*, 61*a* and 61*b*.

In accordance with the third embodiment, it is no longer necessary to arrange an auxiliary power source, a switch for switching a substrate voltage, and an external control system, all of which are required in a conventional CMOS invertor. Hence, a potential at a substrate can be efficiently controlled.

CMOS invertor illustrated in FIG. 8A has almost the same layout as that of CMOS invertor illustrated in FIG. 8B except that the gate polysilicon layers 71*a* and 81*a* extend in a direction different from a direction in which the gate polysilicon layers 71*b* and 81*b* extend. Namely, the gate polysilicon layers 71*a* and 81*a* extend vertically as viewed in a plane of FIG. 8A, whereas the gate polysilicon layers 71*b* and 81*b* extend horizontally as viewed in a plane of FIG. 8B. Directions in which the gate polysilicon layers 71*a*, 71*b*, 81*a* and 81*b* extend are optimally determined, considering the positional relationship with other elements to be situated in the vicinity of CMOS invertor.

Figure 10B:
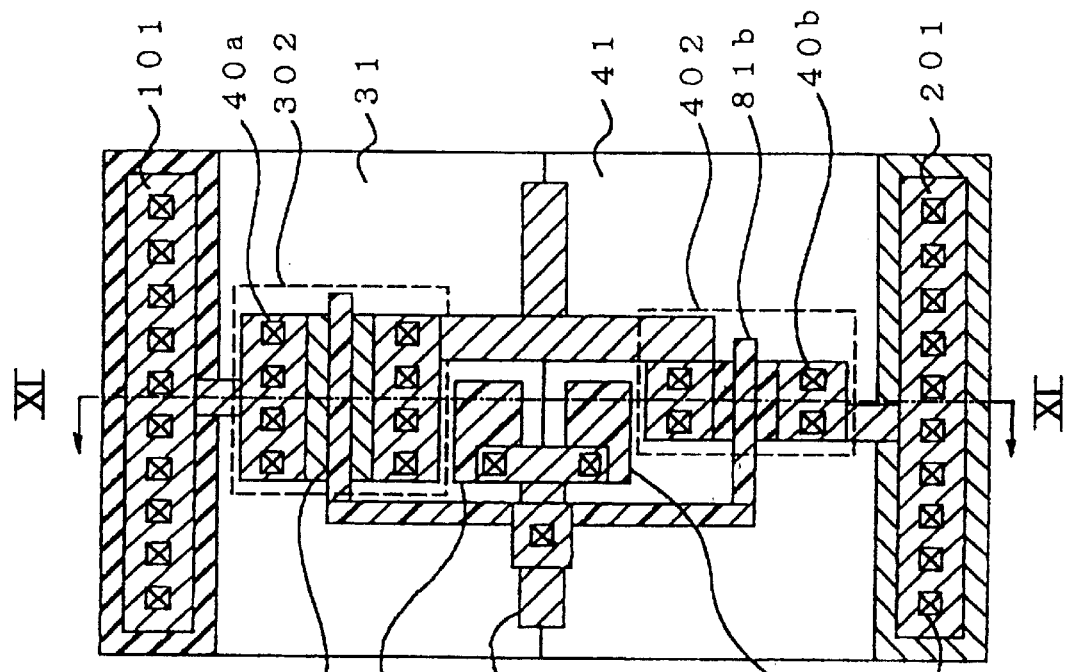
FIGS. 10A and 10B are plan views of CMOS invertor in accordance with the fourth embodiment.
Figure 10A:
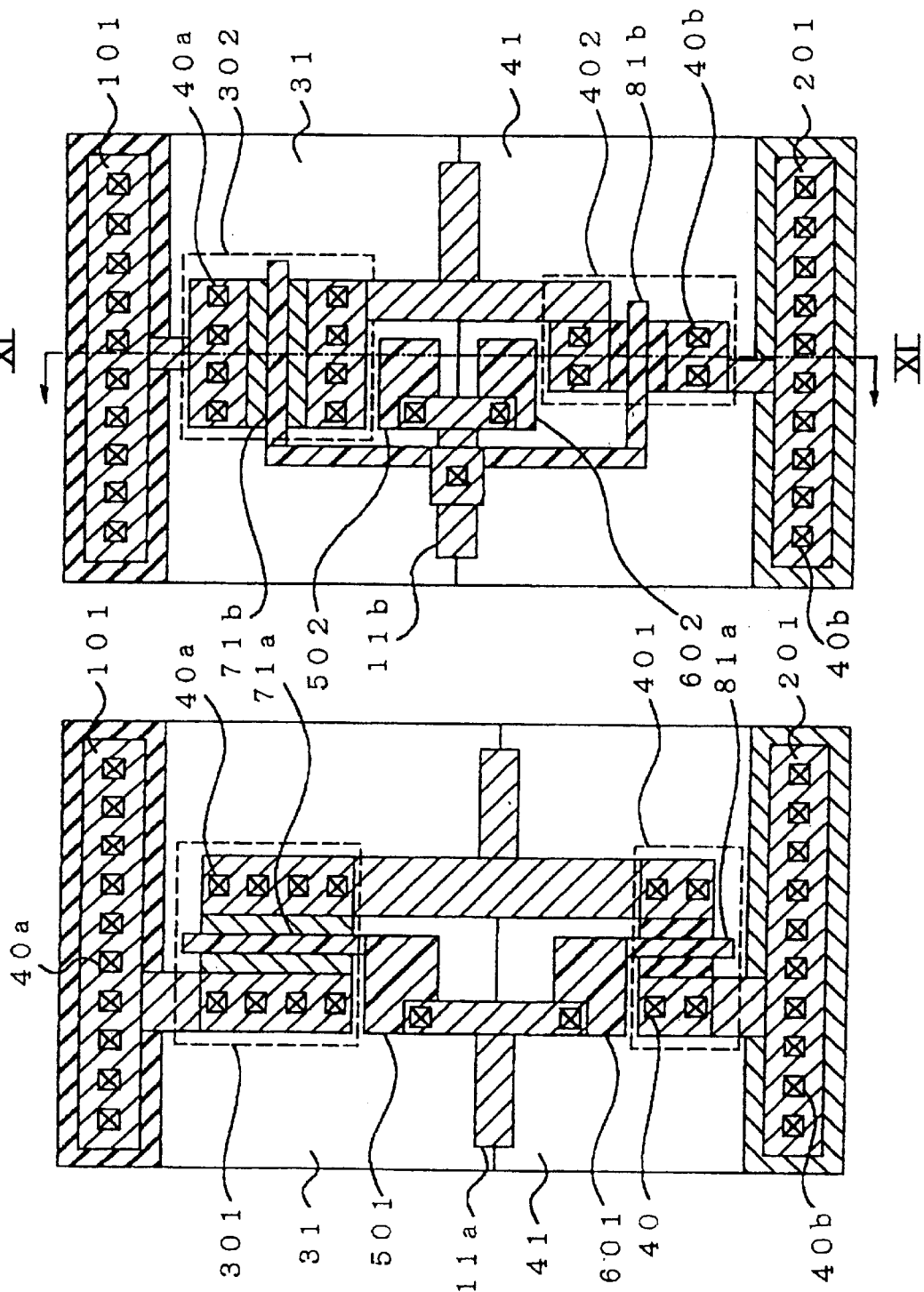
Figure 11:
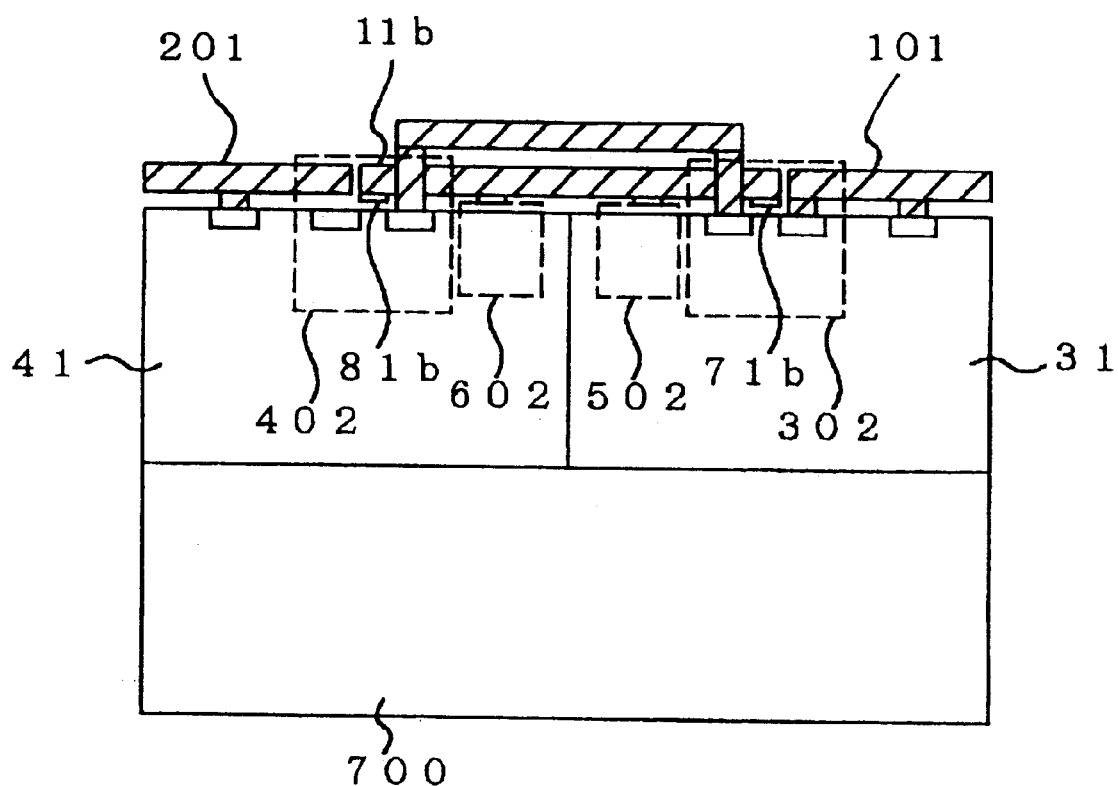
FIG. 11 is a cross-sectional view taken along the line XI and XI in FIG. 10B.

FIGS. 10A and 10B are another plan views of CMOS invertor illustrated in FIG. 2, and FIG. 11 is a cross-sectional view taken along the line XI and XI in FIG. 10B. CMOS invertor illustrated in FIG. 10A has almost the same structure as that of CMOS structure illustrated in FIG. 8A except that MOS gate capacitors 501 and 601 are substituted for the coupling capacitors 51*a* and 61*a*. Similarly, the CMOS invertor illustrated in FIG. 10B has almost the same structure as that of the CMOS structure illustrated in FIG. 8B except that MOS gate capacitors 502 and 602 are substituted for the coupling capacitors 51*b* and 61*b*. The use of MOS gate capacitors 501, 502, 601 and 602 provides an advantage that there is almost no dependency of a capacitor on a voltage, and that there is almost no dispersion in the capacitor.

Figure 12:
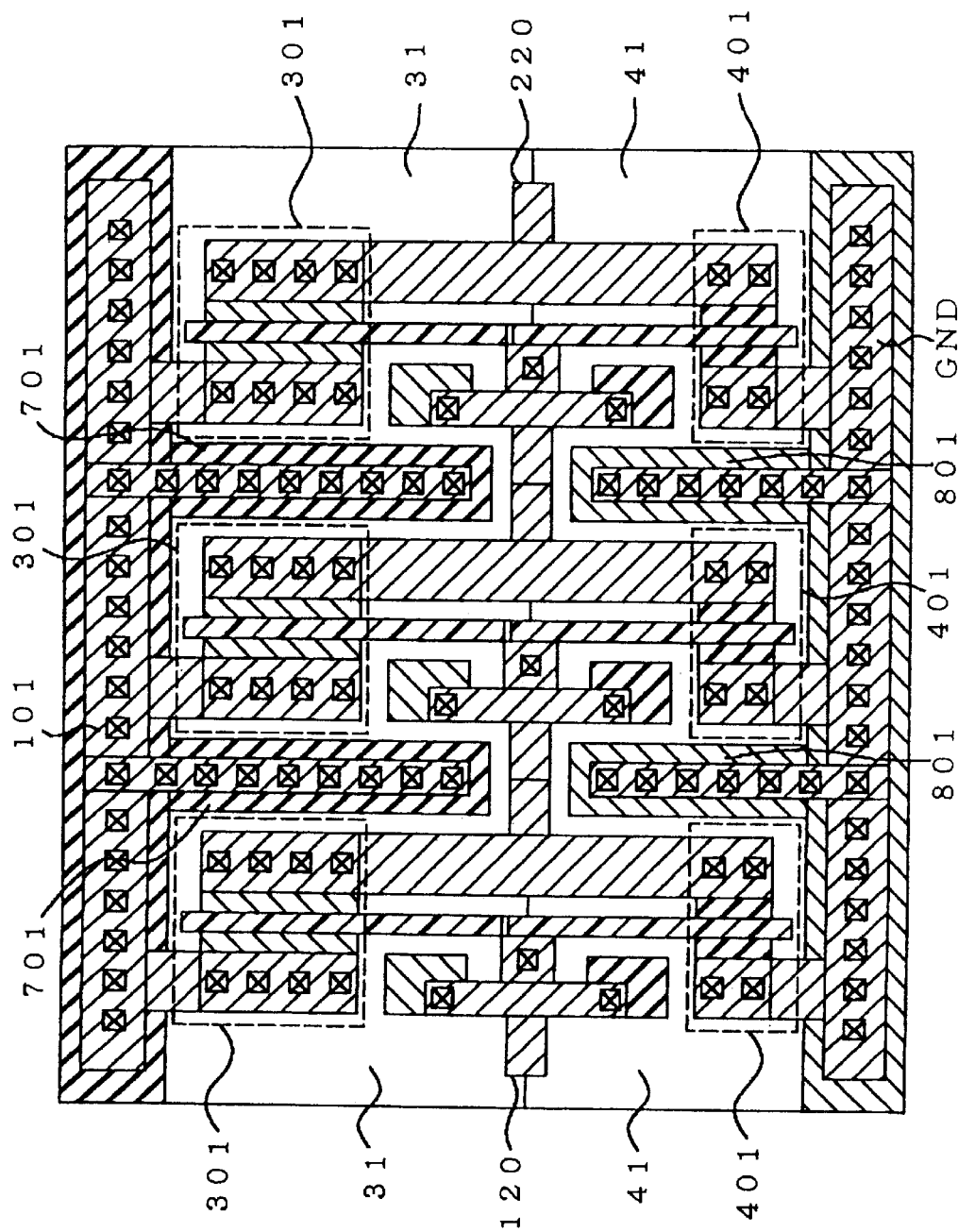
FIG. 12 is a plan view of CMOS gate circuit comprised of a plurality of CMOS invertors in accordance with the third embodiment, connected in cascade.

FIG. 12 illustrates an invertor circuit in accordance with the fifth embodiment of the present invention. The illustrated invertor circuit includes three CMOS invertors illustrated in FIG. 8A, arranged horizontally. Input sections 120 and output sections 220 of the three CMOS invertors are electrically connected in series to each other. Specifically, an input is introduced into the illustrated invertor through the input section 120 of the leftmost CMOS invertor, transferred through the three CMOS invertors, and then generated as an output through the output section 220 of the rightmost CMOS invertor.

The invertor circuit illustrated in FIG. 12 is characterized by both n-type diffusion regions 701 and p-type diffusion regions 801 being sandwiched between the three CMOS invertors. The formation of the n-type diffusion regions 701 and p-type diffusion regions 801 between the three CMOS invertors provides an advantage in that fluctuation in a potential, generated in a substrate of one of the three MOS transistors, exerts no influence on MOS transistor located adjacent thereto. That is, it is possible to prevent such a fluctuation in a potential from entering adjacent MOS transistors as a noise which causes a malfunction thereof.

In the above-mentioned embodiments, a silicon-on-insulator (SOI) structure is quite effective for separation of substrate bonding between transistors as well as between coupling capacitors. The SOI structure restricts a region to be driven by coupling capacitors, which ensures that the substrate potential significantly varies.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-162867 filed on Jun. 19, 1998 including specification, claims, drawings and summary is incorporated herein by reference in its entirety.

What is claimed is:

1. A CMOS logic circuit comprising:
   (a) a PMOS transistor;
   (b) an NMOS transistor;
   (c) a first coupling capacitor electrically connected between a gate and a drain of said PMOS transistor; and
   (d) a second coupling capacitor electrically connected between a gate and a drain of said NMOS transistor,
   said PMOS and NMOS transistors including substrates, voltages of which are made higher than associated reference voltages at rise edges of signals transmitted to said gates, and made lower than said associated reference voltages at fall edges of said signals.

2. The CMOS logic circuit as set forth in claim 1, wherein gates of said PMOS and NMOS transistors are electrically connected to each other and drains of said PMOS and NMOS transistors are electrically connected to each other, and wherein an input signal is introduced into the thus electrically connected gates and an output signal is taken through the thus electrically connected drains.

3. The CMOS logic circuit as set forth in claim 1, wherein each of said first and second coupling capacitors comprises a PN junction capacitor formed between a respective one of said substrates having a first conductivity type and a respective diffusion region having a second conductivity type in said substrate.

4. The CMOS logic circuit as set forth in claim 1, wherein each of said first and second coupling capacitors comprises a gate insulating film.

5. The CMOS logic circuit as set forth in claim 1, wherein said CMOS logic circuit comprises a plurality of PMOS and NMOS transistors, wherein a plurality of diffusion regions formed between said plurality of PMOS and NMOS transistors have the same conductivity type as that of an associated substrate of said plurality of PMOS and NMOS transistors, and wherein a constant bias voltage is applied to each type of said plurality of diffusion regions.

6. The CMOS logic circuit as set forth in claim 1, wherein said CMOS logic circuit further comprises a substrate having a silicon-on-insulator (SOI) structure.

7. The CMOS logic circuit as set forth in claim 1, wherein each of said first and second coupling capacitors comprises a MOS gate capacitor.

8. A CMOS logic circuit comprising:
   (a) a PMOS transistor;
   (b) an NMOS transistor;
   (c) a first coupling capacitor electrically connected between a gate and a drain of said PMOS transistor; and
   (d) a second coupling capacitor electrically connected between a gate and a drain of said NMOS transistor,
   said PMOS transistor being designed and adapted to have a higher threshold voltage and said NMOS transistor being designed and adapted to have a lower threshold voltage than an associated reference voltage at rising edges of signals transmitted to gates of said PMOS and NMOS transistors, and
   said PMOS transistor being designed and adapted to have a lower threshold voltage and said NMOS transistor being designed and adapted to have a higher threshold voltage than an associated reference voltage at falling edges of signals transmitted to gates of said PMOS and NMOS transistors.

9. A CMOS NAND logic circuit comprising:
   (a) a first PMOS transistor;
   (b) a second PMOS transistor;
   (c) a first NMOS transistor;
   (d) a second NMOS transistor;
   (e) a first coupling capacitor electrically connected between a gate and a drain of said first PMOS transistor;
   (f) a second coupling capacitor electrically connected between a gate and a drain of said second PMOS transistor;
   (g) a third coupling capacitor electrically connected between a gate and a drain of said first NMOS transistor;
   (h) a fourth coupling capacitor electrically connected between a gate and a drain of said second NMOS transistor,
   said first and second PMOS and NMOS transistors including substrates, voltages of which are made higher than associated reference voltages at rising edges of signals transmitted to said gates, and made lower than said associated reference voltages at falling edges of said signals.

10. The CMOS NAND logic circuit as set forth in claim 9, wherein gates of said first PMOS and said first NMOS transistors are electrically connected to each other, drains of said first and said second PMOS and said first NMOS transistors are electrically connected to each other to provide an output signal, and gates of said second PMOS and said second NMOS transistors are electrically connected to each other, and wherein a first input signal is provided to said gates of said first PMOS and said first NMOS transistors, and a second input signal is provided to said gates of said second PMOS and said second NMOS transistors.

11. The CMOS NAND logic circuit as set forth in claim 10, wherein a source of said first NMOS transistor and a drain of said second NMOS transistor are electrically connected to each other.

12. The CMOS NAND logic circuit as set forth in claim 9, wherein each of said first through fourth coupling capacitors comprises a PN junction capacitor between a respective one of said substrates and a respective diffusion region in said substrate.

13. The CMOS NAND logic circuit as set forth in claim 9, wherein each of said first through fourth coupling capacitors comprises a gate insulating film.

14. The CMOS NAND logic circuit as set forth in claim 9, further comprising a plurality of PMOS and NMOS transistors, wherein a plurality of diffusion regions between said PMOS and NMOS transistors have the same conductivity type as that of an associated substrate of each of said PMOS and NMOS transistors, and wherein a constant bias voltage is applied to each of said diffusion regions.

15. The CMOS NAND logic circuit as set forth in claim 9, wherein each of said substrates have a silicon-on-insulator (SOI) structure.

16. The CMOS NAND logic circuit as set forth in claim 9, wherein each of said first and second coupling capacitors comprises a MOS gate capacitor.

17. A CMOS NAND logic circuit comprising:
(a) a first PMOS transistor;
(b) a second PMOS transistor;
(c) a first NMOS transistor;
(d) a second NMOS transistor;
(e) a first coupling capacitor electrically connected between a gate and a drain of said first PMOS transistor;
(f) a second coupling capacitor electrically connected between a gate and a drain of said second PMOS transistor;
(g) a third coupling capacitor electrically connected between a gate and a drain of said first NMOS transistor; and
(h) a fourth coupling capacitor electrically connected between a gate and a drain of said second NMOS transistor,
said first and second PMOS and NMOS transistors being designed and adapted to have a higher threshold voltage, and each of said first and second NMOS transistors being designed and adapted to have a lower threshold voltage than an associated reference voltage at rising edges of signals transmitted to gates of said first and second PMOS and NMOS transistors, and
said first and second PMOS transistors being designed and adapted to have a lower threshold voltage, and said first and second NMOS transistors being designed and adapted to have a higher threshold voltage than an associated reference voltage at falling edges of signals transmitted to gates of said first and second PMOS and NMOS transistors.

18. A method of driving a CMOS logic circuit including: (a) a PMOS transistor; (b) an NMOS transistor; (c) a first coupling capacitor electrically connected between a gate and a drain of said PMOS transistor; and (d) a second coupling capacitor electrically connected between a gate and a drain of said NMOS transistor, comprising the steps of:
providing voltages at substrates of said PMOS and NMOS transistors, which voltages are higher than associated reference voltages during time intervals when a leading edge of an input signal is transmitted to said gates; and
providing voltages at the substrates of each of the PMOS and NMOS transistors which are lower than the associated reference voltages during time intervals when a trailing edge of an input signal is transmitted to the gates.

19. The method as set forth in claim 18, further comprising the steps of:
introducing an input signal into the gates of the PMOS and NMOS transistors; and
taking an output signal through the drains of the PMOS and NMOS transistors.

20. A method of driving a CMOS logic circuit including: (a) a PMOS transistor; (b) an NMOS transistor; (c) a first coupling capacitor electrically connected between a gate and a drain of said PMOS transistor; and (d) a second coupling capacitor electrically connected between a gate and a drain of said NMOS transistor, the method comprising the steps of:
developing a threshold voltage of said PMOS transistor higher and a threshold voltage of said NMOS transistor lower than an associated reference voltage during a time interval when a leading edge of an input signal is transmitted to the gates of said PMOS and NMOS transistors, and
developing the threshold voltage of said PMOS transistor lower and the threshold voltage of said NMOS transistor higher than the associated reference voltage during a time interval when a trailing edge of an input signal is transmitted to the gates of the PMOS and NMOS transistors.

21. A method of driving a CMOS NAND logic circuit including: (a) a first PMOS transistor; (b) a second PMOS transistor; (c) a first NMOS transistor; (d) a second NMOS transistor; (e) a first coupling capacitor electrically connected between a gate and a drain of said first PMOS transistor; (f) a second coupling capacitor electrically connected between a gate and a drain of said second PMOS transistor; (g) a third coupling capacitor electrically connected between a gate and a drain of said first NMOS transistor; and (h) a fourth coupling capacitor electrically connected between a gate and a drain of said second NMOS transistor, the first PMOS and the first NMOS transistors having respective gates connected together for receiving a first input signal, the second PMOS and the second NMOS transistors having respective gates connected together for receiving a second input signal, the first and second PMOS transistors and the first NMOS transistor having respective drains connected together for providing an output signal, the second NMOS transistor having a drain connected to a source of the first NMOS transistor, the method comprising the steps of:
providing voltages at the substrates of said first and second PMOS and NMOS transistors, which voltages are higher than associated reference voltages during a time interval when a leading edge of an input signal is transmitted to said gates; and providing voltages at the substrates of each of the first and second PMOS and NMOS transistors, which voltages are lower than said associated reference voltages during time intervals when a trailing edge of an input signal is transmitted to the gates.

22. The method as set forth in claim 21, further comprising the steps of:

introducing a first input signal into the electrically connected gates of said first PMOS and the first NMOS transistors;

introducing a second input signal into the electrically connected gates of said second PMOS and second NMOS transistors; and taking an output signal from the electrically connected drains of said first and second PMOS transistors and the first NMOS transistor.

23. A method of driving a CMOS NAND logic circuit including: (a) a first PMOS transistor; (b) a second PMOS transistor; (c) a first NMOS transistor; (d) a second NMOS transistor; (e) a first coupling capacitor electrically connected between a gate and a drain of said first PMOS transistor; (f) a second coupling capacitor electrically connected between a gate and a drain of said second PMOS transistor; (g) a third coupling capacitor electrically connected between a gate and a drain of said first NMOS transistor; and (h) a fourth coupling capacitor electrically connected between a gate and a drain of said second NMOS transistor, the first and second PMOS transistors and the first NMOS transistor having respective drains connected together for providing an output signal, the second NMOS transistor having a drain connected to a source of the first NMOS transistor for providing an intermediate signal, the method comprising the steps of:

developing a threshold voltage of said first and second PMOS transistors higher and a threshold voltage of said first and second NMOS transistors lower than an associated reference voltage during a time interval when a leading edge of an input signal is transmitted to the gates of said first and second PMOS and the first and second NMOS transistors, and developing the threshold voltage of said first and second PMOS transistors lower and the threshold voltage of said first and second NMOS transistors higher than the associated reference voltage during a time interval when a trailing edge of an input signal is transmitted to the gates of said first and second PMOS and the first and second NMOS transistors.

* * * * *